United States Patent
Wong et al.

(10) Patent No.: US 8,921,946 B2
(45) Date of Patent: Dec. 30, 2014

(54) INTEGRATED CIRCUIT RESISTOR

(75) Inventors: King-Yuen Wong, Hsinchu (TW); Chia-Pin Lin, Xinpu Township, Hsinchu County (TW); Chia-Yu Lu, Hsinchu (TW); Yi-Cheng Tsai, Taoyuan (TW); Da-Wen Lin, Hsinchu (TW); Kuo-Feng Yu, Hsinchu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 363 days.

(21) Appl. No.: 13/294,251

(22) Filed: Nov. 11, 2011

(65) Prior Publication Data
US 2013/0119480 A1    May 16, 2013

(51) Int. Cl.
*H01L 29/772* (2006.01)
*H01L 21/265* (2006.01)
*H01L 27/06* (2006.01)
*H01L 29/8605* (2006.01)
*H01L 29/66* (2006.01)

(52) U.S. Cl.
CPC ...... *H01L 21/26506* (2013.01); *H01L 27/0629* (2013.01); *H01L 29/8605* (2013.01); *H01L 29/66545* (2013.01)
USPC ............ 257/380; 257/E21.004; 257/E29.002; 257/E29.242; 257/536; 438/384

(58) Field of Classification Search
CPC ....................... H01L 21/26506; H01L 27/0629; H01L 29/66545; H01L 29/8605
USPC .................. 257/380, 536, E21.004, E29.002, 257/E29.242; 438/384
See application file for complete search history.

(56) References Cited

U.S. PATENT DOCUMENTS

| | | | |
|---|---|---|---|
| 7,846,783 B2* | 12/2010 | Mehrotra et al. | 438/142 |
| 8,283,711 B2* | 10/2012 | Jin et al. | 257/295 |
| 8,334,579 B2* | 12/2012 | Yeh et al. | 257/475 |
| 8,361,848 B2* | 1/2013 | Lee et al. | 438/171 |
| 2006/0157748 A1* | 7/2006 | Chong et al. | 257/288 |
| 2008/0014693 A1* | 1/2008 | Matocha | 438/238 |
| 2008/0217740 A1 | 9/2008 | Shiramizu et al. | |
| 2009/0071710 A1* | 3/2009 | Stelzl et al. | 174/520 |
| 2010/0078645 A1* | 4/2010 | Kurz et al. | 257/66 |
| 2010/0112764 A1 | 5/2010 | Mehrotra et al. | |
| 2010/0164001 A1* | 7/2010 | Park et al. | 257/369 |
| 2010/0327370 A1* | 12/2010 | Jan et al. | 257/380 |
| 2011/0171810 A1* | 7/2011 | Tseng et al. | 438/382 |
| 2011/0318897 A1* | 12/2011 | Shang et al. | 438/382 |
| 2013/0049168 A1* | 2/2013 | Yang et al. | 257/538 |
| 2013/0105912 A1* | 5/2013 | Hsu et al. | 257/379 |
| 2013/0126955 A1* | 5/2013 | Wang et al. | 257/296 |

* cited by examiner

*Primary Examiner* — Stephen W Smoot
*Assistant Examiner* — Edward Chin
(74) *Attorney, Agent, or Firm* — Haynes and Boone, LLP

(57) ABSTRACT

A semiconductor device includes a substrate including an isolation region, and a resistor disposed over the isolation region, wherein the resistor includes an implant with an inverse box-like dopant profile that minimizes resistance variation from subsequent planarization variation. A contact is disposed over the resistor. A method of fabricating such a semiconductor device is also provided.

20 Claims, 5 Drawing Sheets

INTEGRATED CIRCUIT RESISTOR

BACKGROUND

The semiconductor integrated circuit (IC) industry has experienced rapid growth. Technological advances in IC materials and design have produced generations of ICs where each new generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component or line that can be created using a fabrication process) has decreased. This scaling-down process generally provides benefits by increasing production efficiency and lowering associated costs.

During the scaling trend, various materials have been used for the gate electrode and gate dielectric in field effect transistors (FET). One approach is to fabricate these devices with a metal material for the gate electrode and a high-k dielectric for the gate dielectric. However, high-k metal gate (HKMG) devices often require planarization processing and planarization variance causes a fluctuation in the resistance of an IC resistor that is simultaneously fabricated with the HKMG device.

SUMMARY

The present disclosure provides for many different embodiments. One of the broader forms of the present disclosure involves a semiconductor device. The device includes a substrate including an isolation region, and a resistor disposed over the isolation region, wherein the resistor includes an implant with an inverse box-like dopant profile that minimizes resistance variation from subsequent planarization variation. A contact is disposed over the resistor.

Another of the broader forms of the present disclosure involves another semiconductor device. The device includes a substrate including an isolation region and a device region, and a resistor disposed over the isolation region, wherein the resistor includes an implant with an inverse box-like dopant profile that minimizes resistance variation from subsequent planarization variation. The device further includes a high-k metal gate (HKMG) device disposed over the device region, the HKMG device including a metal gate disposed over the device region, a plurality of interlayer dielectric (ILD) layers disposed over the resistor and the HKMG device, a first contact disposed over and contacting the resistor through the plurality of ILD layers, and a second contact disposed over and contacting the HKMG device through the plurality of ILD layers.

Yet another of the broader forms of the present disclosure involves a method of fabricating a semiconductor device. The method includes providing a substrate including an isolation region, forming a resistor over the isolation region, implanting the resistor with an inverse box-like dopant profile that minimizes resistance variation from subsequent planarization variation, planarizing the resistor, and forming a contact over the resistor.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
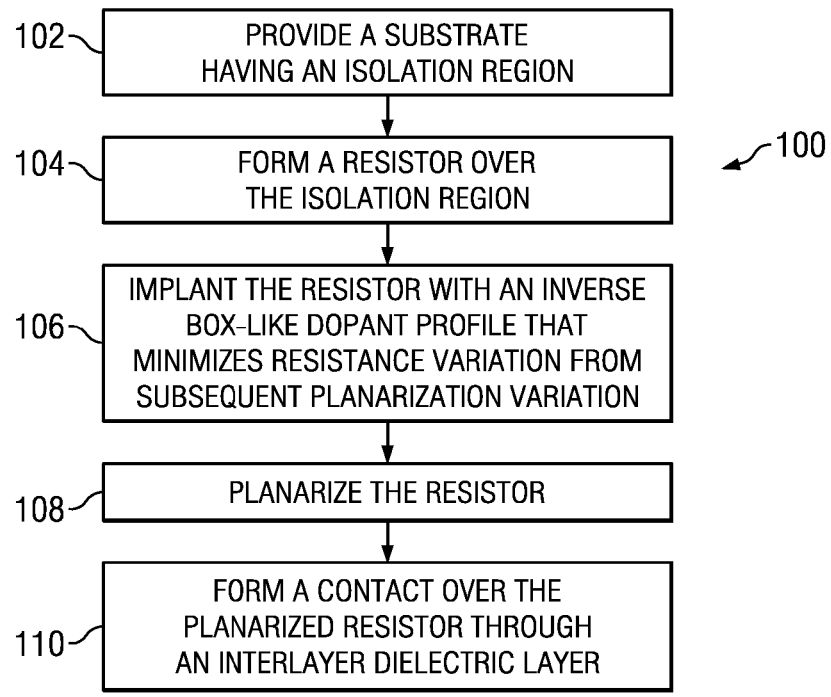
FIG. 1 is a flowchart showing a method of fabricating a semiconductor device in accordance with embodiments of the present disclosure.

It is understood that the following disclosure provides many different embodiments, or examples, for implementing different features of the disclosure. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity. It is noted that the same or similar features may be similarly numbered herein for the sake of simplicity and clarity. In addition, some of the drawings may be simplified for clarity. Thus, the drawings may not depict all of the components of a given apparatus (e.g., device) or method.

Various aspects of the present disclosure will be described herein with reference to drawings that are schematic illustrations of idealized configurations of the present disclosure. As such, variations from the shapes of the illustrations as a result, for example, manufacturing techniques and/or tolerances, are to be expected. Thus, the various aspects of the present disclosure presented throughout this disclosure should not be construed as limited to the particular shapes of elements (e.g., regions, layers, sections, substrates, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another. Thus, the elements illustrated in the drawings are schematic in nature and their shapes are not intended to illustrate the precise shape of an element and are not intended to limit the scope of the present disclosure.

It will be understood that when an element such as a region, layer, section, substrate, or the like, is referred to as being "on" another element, it can be directly on the other element or intervening elements may also be present. In contrast, when an element is referred to as being "directly on" another element, there are no intervening elements present. It will be further understood that when an element is referred to as being "formed" on another element, it can be grown, deposited, etched, attached, connected, coupled, or otherwise prepared or fabricated on the other element or an intervening element.

Furthermore, relative terms, such as "lower" or "bottom" and "upper" or "top", may be used herein to describe one element's relationship to another element as illustrated in the drawings. It will be understood that relative terms are intended to encompass different orientations of an apparatus in addition to the orientation depicted in the drawings. By way of example, if an apparatus in the drawings is turned over, elements described as being on the "lower" side of other elements would then be oriented on the "upper" sides of the other elements. The term "lower", can therefore, encompass both an orientation of "lower" and "upper", depending on the particular orientation of the apparatus. Similarly, if an apparatus in the drawing is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items It will be understood that although the terms "first" and "second" may be used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present disclosure.

It is understood that several processing steps and/or features of a device may be only briefly described, such steps and/or features being well known to those of ordinary skill in the art. Also, additional processing steps or features can be added, and certain of the following processing steps or features can be removed and/or changed while still implementing the claims. Thus, the following description should be understood to represent examples only, and are not intended to suggest that one or more steps or features is required.

Referring now to FIG. 1, a flowchart shows a method 100 of fabricating a semiconductor device in accordance with embodiments of the present disclosure. Method 100 includes providing a substrate having an isolation region at block 102, forming a resistor over the isolation region at block 104, implanting the resistor with an inverse box-like dopant profile that minimizes resistance variation from subsequent planarization variation at block 106, planarizing the resistor at block 108, and forming a contact over the planarized resistor through an interlayer dielectric layer at block 110.

It should be noted that the operations of method 100 may be rearranged or otherwise modified within the scope of the various aspects. It is further noted that additional processes may be provided before, during, and after the method 100, and that some other processes may only be briefly described herein. Thus, other implementations are possible within the scope of the various aspects described herein.

According to an aspect of the present disclosure, forming the resistor includes depositing polysilicon or amorphous silicon.

According to another aspect of the present disclosure, implanting the resistor includes implanting silicon, germanium, carbon, xenon, an n-type dopant, and/or a p-type dopant.

According to yet another aspect of the present disclosure, implanting the resistor includes implanting germanium at an implant concentration between about 1e14 cm$^{-3}$ and about 1e15 cm$^{-3}$ and an implant energy between about 10 k and about 30 k, carbon at an implant concentration between about 1e14 cm$^{-3}$ and about 1e15 cm$^{-3}$ and an implant energy between about 10 k and about 20 k, and indium at an implant concentration between about 1e13 cm$^{-3}$ and about 1e14 cm$^{-3}$ and an implant energy between about 100 k and about 150 k.

According to yet another aspect of the present disclosure, implanting the resistor includes implanting germanium at an implant concentration between about 1e14 cm$^{-3}$ and about 1e15 cm$^{-3}$ and an implant energy between about 10 k and about 30 k, xenon at an implant concentration between about 1e14 cm$^{-3}$ and about 1e15 cm$^{-3}$ and an implant energy between about 10 k and about 30 k, and barium fluoride at an implant concentration between about 1e14 cm$^{-3}$ and about 1e15 cm$^{-3}$ and an implant energy between about 30 k and about 60 k.

According to yet another aspect of the present disclosure, implanting the resistor includes performing an end-of-line thermal process on the resistor.

According to yet another aspect of the present disclosure, the semiconductor fabrication method may further comprise simultaneously fabricating with the resistor a metal oxide semiconductor (MOS) device over a device region of the substrate.

According to yet another aspect of the present disclosure, the semiconductor fabrication method may further comprise forming an interlayer dielectric (ILD) layer over the resistor and the MOS device, and forming a second contact over the MOS device through the ILD layer.

Referring now to FIGS. 2A-2D, sectional views of a semiconductor device 200 at various stages of fabrication are illustrated in accordance with embodiments of the present disclosure. It should be understood that additional processes may be provided before, during, and/or after the stages illustrated in FIGS. 2A-2D, and that some selected processes may only be briefly described if they are well known in the art.

Figure 2A:
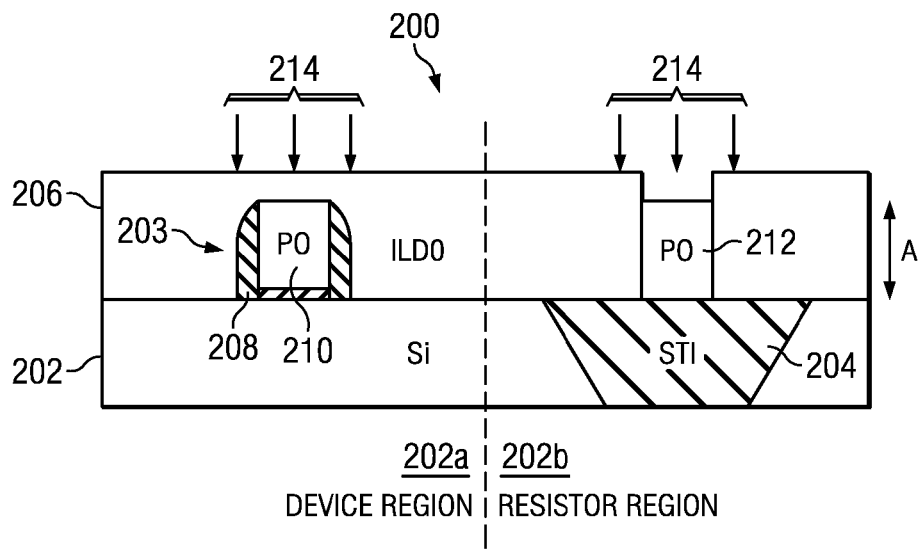
FIGS. 2A-2D illustrate sectional views of a semiconductor device at various stages of fabrication in accordance with embodiments of the present disclosure.

FIG. 2A illustrates semiconductor device 200 including a substrate 202 having a device region 202a and a resistor region or isolation region 202b. A high-k metal gate (HKMG) device 203 is formed over the device region 202a of substrate 202, and a resistor 212 having a thickness A is formed over the isolation region 202b of substrate 202 and isolation structure 204. The HKMG device 203 includes a polysilicon gate 210 between sidewall spacers 208. Polysilicon gate 210 may be formed by polysilicon deposition, polysilicon planarization by CMP or etch, and polysilicon patterning (e.g., via photolithography and etch techniques). The spacers 208 may be comprised of a dielectric material, such as silicon nitride. Alternatively, the spacers may be silicon carbide, silicon oxynitride, other suitable materials, and/or combinations thereof. Also, they may each be composed of a different material. Resistor 212 may comprise polysilicon or amorphous silicon in one example.

HKMG device 203 and resistor 212 are formed within a photoresist layer 206 in this embodiment. In other embodiments, HKMG device 203 and resistor 212 may be formed within an interlayer dielectric (ILD) layer 206.

In one embodiment, the semiconductor device is formed on a silicon semiconductor substrate 202. Alternatively, the semiconductor substrate 202 could be: an elementary semiconductor including germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In one embodiment, the storage element layer 204 is comprised of polysilicon, a nano-crystal film, or a nitride film.

Isolation structure 204 may be comprised of a region of dielectric material formed in a trench etched into the substrate. In one embodiment, isolation structure 204 may utilize shallow trench isolation (STI) to define and electrically isolate devices. An isolation structure may be composed of silicon oxide in one example. However, in other alternative embodiments, the dielectric material could be silicon nitride, silicon oxynitride, other suitable materials, and/or combinations thereof. An isolation structure may alternatively have a multi-layer structure such as a thermal oxide liner layer filled with silicon nitride or silicon oxide.

Arrows 214 illustrate an implantation process of resistor 212 in accordance with embodiments of the present disclosure such that resistor 212 includes an implant with an inverse box-like dopant profile that minimizes resistance variation from subsequent planarization variation.

Figure 2B:
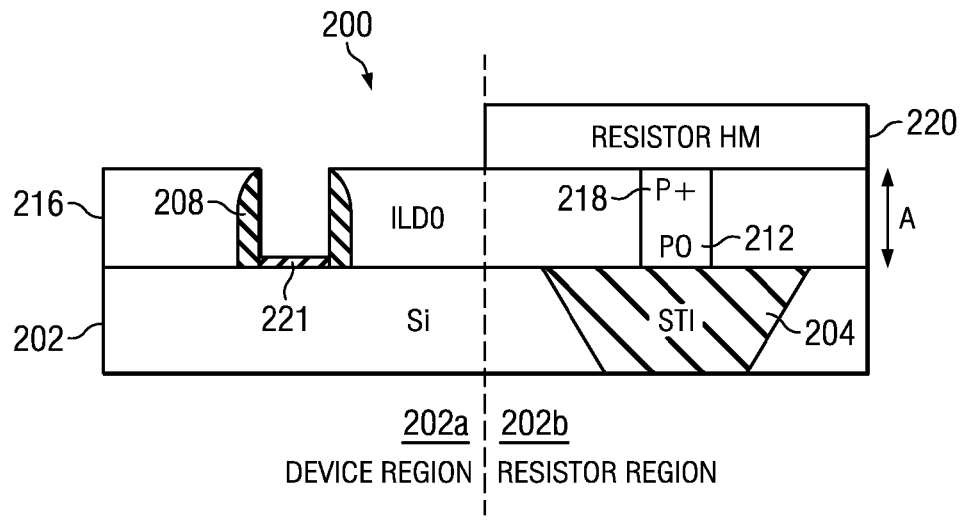

FIG. 2B illustrates implant 218 of resistor 212 after implantation process 214. In one example, the implant 218 of resistor 212 may include silicon, germanium, carbon, xenon, an n-type dopant, and/or a p-type dopant. In one example, the implant includes germanium at an implant concentration between about 1e14 cm$^{-3}$ and about 1e15 cm$^{-3}$ and an implant energy between about 10 k and about 30 k, carbon at an implant concentration between about 1e14 cm$^{-3}$ and about 1e15 cm$^{-3}$ and an implant energy between about 10 k and about 20 k, and indium at an implant concentration between about 1e13 cm$^{-3}$ and about 1e14 cm$^{-3}$ and an implant energy between about 100 k and about 150 k. In another example, the implant 218 includes germanium at an implant concentration between about 1e14 cm$^{-3}$ and about 1e15 cm$^{-3}$ and an implant energy between about 10 k and about 30 k, xenon at an implant concentration between about 1e14 cm$^{-3}$ and about 1e15 cm$^{-3}$ and an implant energy between about 10 k and about 30 k, and barium fluoride at an implant concentration between about 1e14 cm$^{-3}$ and about 1e15 cm$^{-3}$ and an implant energy between about 30 k and about 60 k.

The photoresist layer 206 is removed (e.g., by stripping or ashing) and then an interlayer dielectric (ILD) layer 216 may be formed by dielectric deposition and planarization (e.g., by CMP). A resistor hard mask 220 is formed over the resistor region 202b and resistor 212, and then polysilicon gate 210 is removed (e.g., by etching).

A high-k (HK) dielectric layer 221 may then be formed between spacers 208 over substrate 202. In one example, HK dielectric layer 221 may function as a metal gate dielectric layer for a subsequently formed metal gate. In one embodiment, HK dielectric layer 221 may be comprised of hafnium oxide (HfOx), hafnium silicon oxide (HfSiO), and/or hafnium silicon oxynitride (HfSiON). HK dielectric layer 221 may be formed as a single layer, or it may optionally include additional layers such as an interfacial layer between the substrate surface and the remainder of the HK dielectric layer.

Figure 2C:
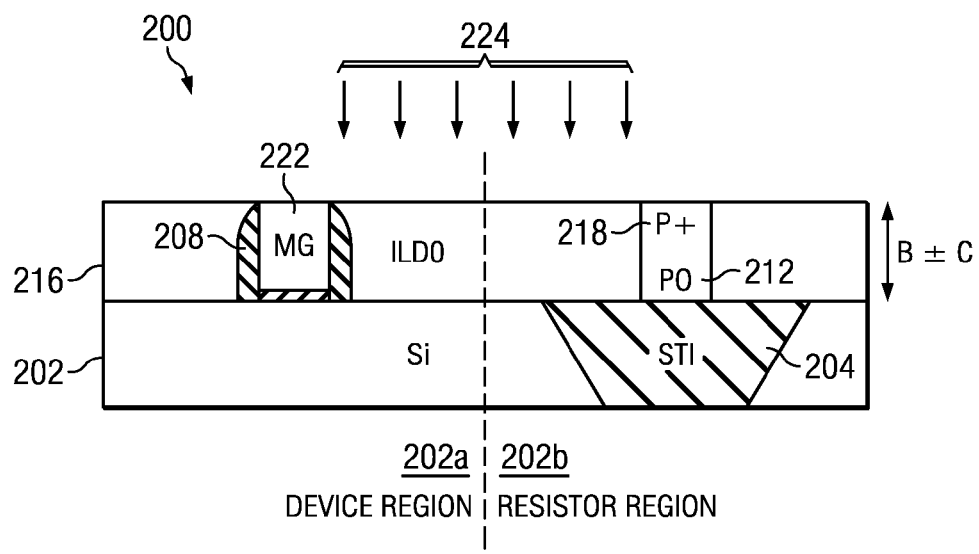

FIG. 2C illustrates replacement of polysilicon gate 210 with metal gate 222. Metal gate 222 is formed by metal deposition and then planarization as shown by arrows 224, resulting in metal gate 222 having a thickness B with a variance of ±C, where B is less than A. In one example, A may be about 600 angstroms, B may be about 400 angstroms, and C may be about 50 angstroms, but other thicknesses before and after planarization are within the scope of the present disclosure. Back-end-of-line thermal processing may then be performed on resistor 212. Disadvantageously, CMP thickness or profile variance has a strong impact on resistor resistance.

In this gate replacement process, the polysilicon select gates are removed and replaced with metal select gates. In one embodiment, a non-illustrated photoresist layer may be deposited and patterned to facilitate etching that effects the removal. The polysilicon gates may be removed by any suitable process, such as a dry etching and/or wet etching process. After etching away the polysilicon and then stripping the photoresist, a metal layer may be formed and then planarized to form the metal select gate structures.

Figure 2D:
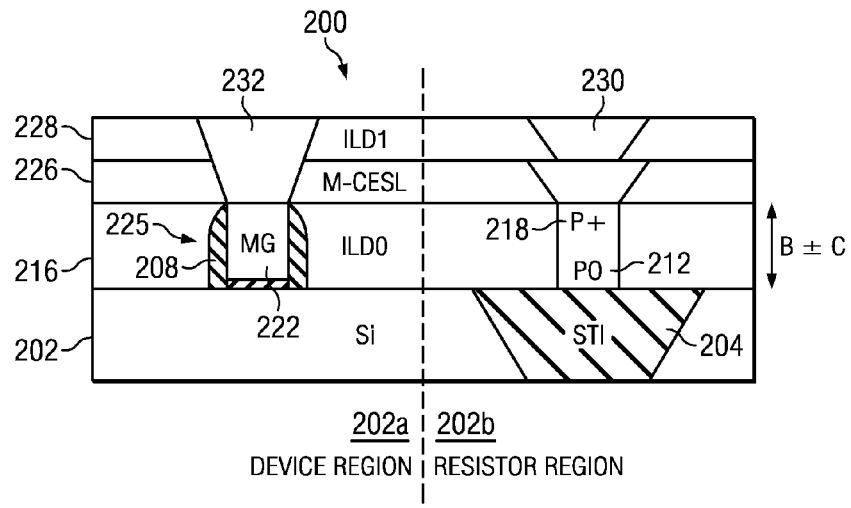

FIG. 2D illustrates the formation of a plurality of interlayer dielectric (ILD) layers 226 and 228 over the resistor 212 and the HKMG device 225 (203 in FIG. 2A), a first contact 230 over and contacting the resistor 212 through the plurality of ILD layers, and a second contact 232 over and contacting the HKMG device 225 through the plurality of ILD layers.

FIG. 2D thus illustrates a semiconductor device 200 comprising a substrate 202 including a device region 202a and an isolation region 202b; a resistor 212 disposed over the isolation region, wherein the resistor includes an implant 218 with an inverse box-like dopant profile that minimizes resistance variation from subsequent planarization variation; a high-k metal gate (HKMG) device 225 disposed over the device region, the HKMG device including a metal gate 222 disposed over the device region; a plurality of interlayer dielectric (ILD) layers 226, 228 disposed over the resistor 212 and the HKMG device 225; a first contact 230 disposed over and contacting the resistor implant 218 through the plurality of ILD layers; and a second contact 232 disposed over and contacting the HKMG device 225 through the plurality of ILD layers.

The ILD layers described above may be comprised of silicon oxide. Alternatively, the ILD layer may include other dielectric materials such as silicon nitride, silicon oxynitride, TEOS formed oxide, phosphosilicate glass (PSG), borophosphosilicate glass (BPSG), low-k dielectric materials, other suitable dielectric materials, and/or combinations thereof. Exemplary low-k dielectric materials include fluorinated silica glass (FSG), carbon doped silicon oxide, Black Diamond® (Applied Materials of Santa Clara, Calif.), xerogel, aerogel, amorphous fluorinated carbon, parylene, BCB (bis-benzocyclobutenes), SiLK® (Dow Chemical, Midland, Mich.), polyimide, other proper materials, and/or combinations thereof. An ILD layer may alternatively be a multilayer structure having multiple dielectric materials.

The gate contacts described above may be any of a variety of cross-sectional shapes. The source and drain contacts may also be comprised of various suitable conductive materials, such as copper or tungsten. In one embodiment, an opening may be etched through the ILD layer at a location above a source and/or drain region. The opening may then be filled with a metal. The above contact formation processes may include photolithography, etching, stripping, deposition, and any other appropriate procedures. Lastly, a CMP process is performed to planarize the top portions of the ILD layer.

The layers described above (e.g., the polysilicon and metal layers) may each be formed using any suitable process, such as chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable methods, and/or combinations thereof.

The layers may be patterned by any suitable process, such as by a photolithography patterning process, which may include any number of suitable steps including photoresist coating (e.g., spin-on coating), soft baking, mask aligning, exposure, post-exposure baking, developing the photoresist, rinsing, drying (e.g., hard baking), other suitable processes, and/or combinations thereof. Further, the photolithography exposing process may be wholly replaced by other proper methods, such as maskless photolithography, electron-beam writing, or ion-beam writing.

Additionally, the integrated circuit in the semiconductor device 200 can further include non-illustrated passive components such as resistors, capacitors, inductors, and/or fuses; and not-illustrated active components, such as MOSFETs including p-channel MOSFETs (pMOS transistors) and n-channel MOSFETs (nMOS transistors), complementary metal-oxide-semiconductor transistors (CMOSs), high voltage transistors, and/or high frequency transistors; other suitable components; and/or combinations thereof.

Figure 3:
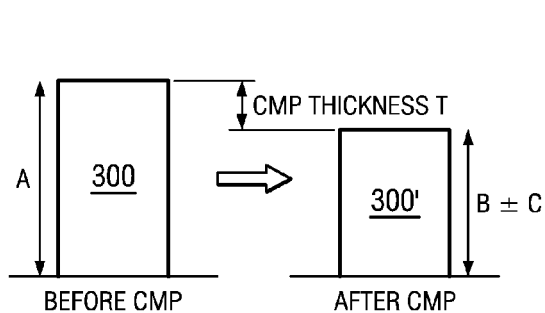
FIG. 3 illustrates planarization of an IC resistor.

FIG. 3 illustrates planarization of an IC resistor 300 (e.g., process 224 on a polysilicon or amorphous silicon IC resistor 212 of FIG. 2C) to IC resistor 300' before CMP and after CMP, respectively. IC resistor 300 prior to CMP has a first thickness A and IC resistor 300' after CMP has a second thickness B±C, where B is less than A and C is less than both A and B. A CMP thickness T is shown as the difference between A and B, which will vary as B has the variance C. In one example, A may be about 600 angstroms, B may be about 400 angstroms, and C may be about 50 angstroms, thus having a CMP thickness of about 200 angstroms ±50 angstroms, but other thicknesses before and after planarization are within the scope of the present disclosure.

Figure 4:
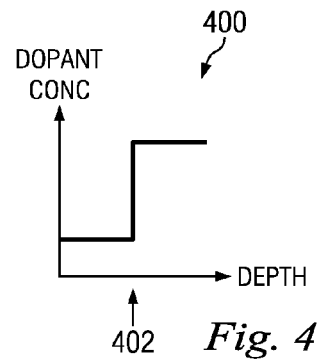
FIG. 4 illustrates an inverse box-like dopant profile for an IC resistor.

FIG. 4 illustrates an inverse box-like dopant profile 400 for an IC resistor, showing dopant concentration (y-axis) versus depth (x-axis) in the IC resistor (such as a polysilicon or amorphous silicon IC resistor 212). The dopant or dopants' concentration is step-increased at a depth 402 in the IC resistor to minimize the impact of CMP thickness variance on the resistance of the IC resistor.

Figure 5:
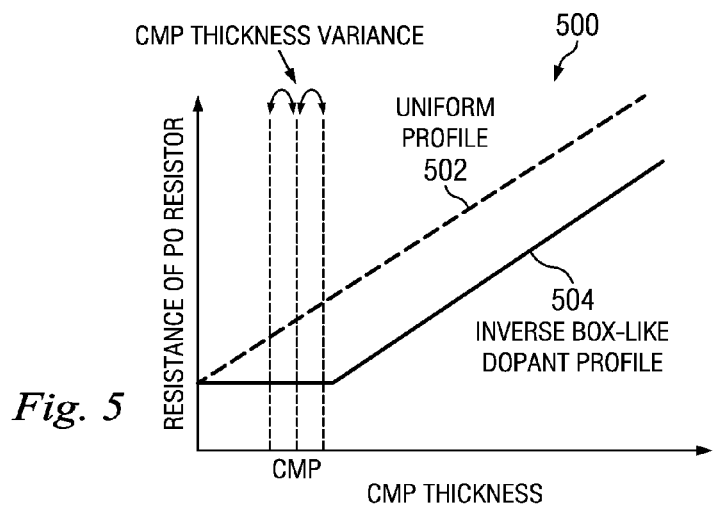
FIG. 5 shows a graph of an IC resistor resistance versus CMP thickness for a resistor with a uniform dopant profile and an inverse box-like dopant profile in accordance with embodiments of the present disclosure.

FIG. 5 shows a graph 500 of an IC resistor resistance (y-axis) versus CMP thickness (x-axis) for a resistor with a uniform dopant profile 502 and an inverse box-like dopant profile 504 in accordance with embodiments of the present disclosure. As shown, the resistor resistance increases in a linear fashion as CMP thickness varies for the resistor implanted with the uniform dopant profile 502, but the resistor resistance is substantially consistent, unchanged, or invariant as CMP thickness varies for the resistor implanted with the inverse box-like dopant profile 504. In other words, the resistor implanted with the inverse box-like dopant profile 504 is substantially independent of CMP thickness variance for a certain range of CMP thickness. Thus, the depth 402 at which the dopant concentration is step-increased may be selected to minimize the resistor resistance change for the range of CMP thickness variance in one embodiment of the present disclosure.

Figure 6A:
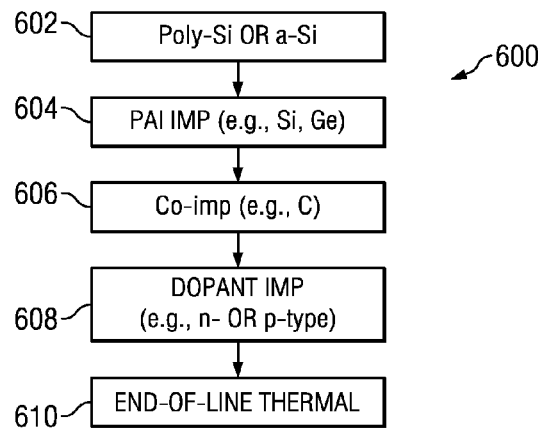
FIG. 6A illustrates an implanting process and FIG. 6B shows a graph of implant concentration versus depth in accordance with embodiments of the present disclosure.
Figure 6B:
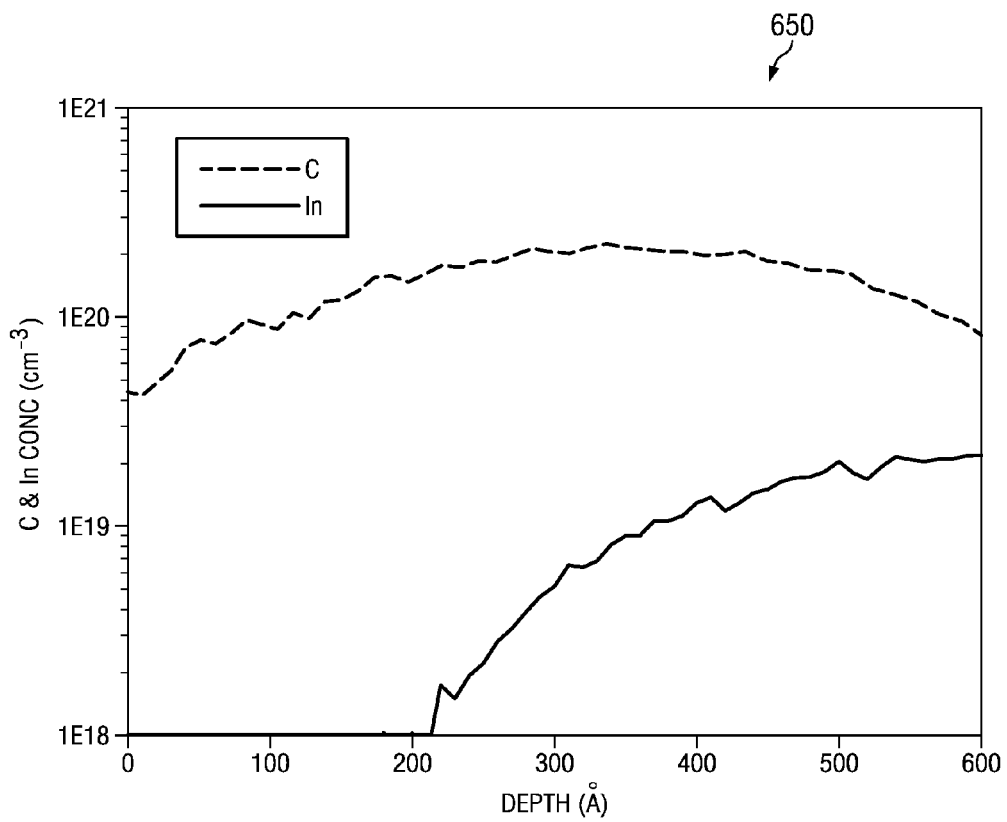

FIG. 6A illustrates an implanting process 600, and FIG. 6B shows a graph 650 of implant concentration (y-axis) versus depth (x-axis) in accordance with embodiments of the present disclosure. In one example, implanting process 600, which may be used for example in process 214 of FIG. 2A, includes providing a polysilicon or amorphous silicon IC resistor (e.g., resistor 212) at block 602, implanting a pre-amorphization implant (PAI) (e.g., silicon or germanium) used to activate carbon and dopants at block 604, implanting a carbon co-implant (e.g., carbon) at block 606, implanting a n-type or p-type dopant at block 608, and providing an end-of-line thermal process at block 610. Advantageously, the carbon co-implant retards dopant diffusion and thus fixes the dopant concentration profile at a step-increase depth (i.e., fixes the dopants at the bottom region) even after several thermal cycles.

In one example, the implanting process includes PAI implanting of germanium at an implant concentration between about 1e14 $cm^{-3}$ and about 1e15 $cm^{-3}$ and an implant energy between about 10 k and about 30 k, carbon co-implanting of carbon at an implant concentration between about 1e14 $cm^{-3}$ and about 1e15 $cm^{-3}$ and an implant energy between about 10 k and about 20 k, and dopant implanting of indium at an implant concentration between about 1e13 $cm^{-3}$ and about 1e14 $cm^{-3}$ and an implant energy between about 100 k and about 150 k.

Figure 7A:
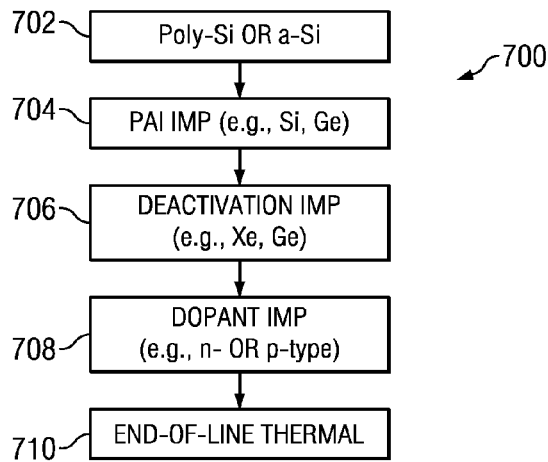
FIG. 7A illustrates another implanting process and FIG. 7B shows a graph of implant concentration versus depth in accordance with embodiments of the present disclosure.
Figure 7B:
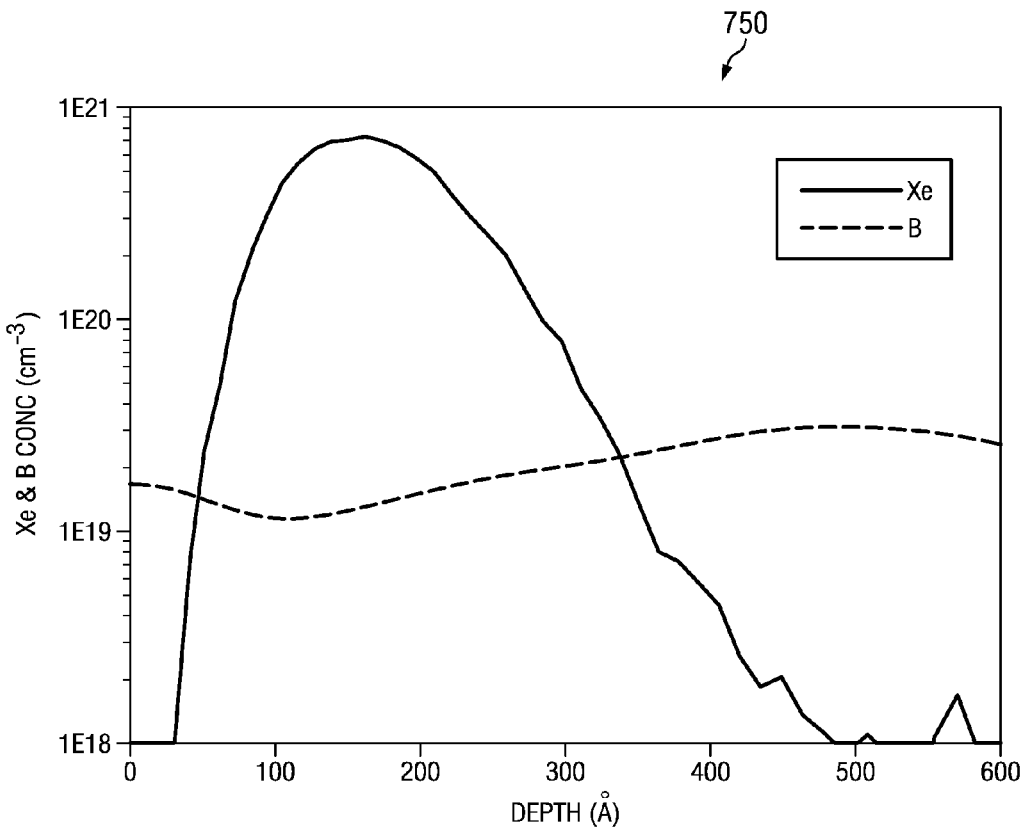

FIG. 7A illustrates another implanting process 700, and FIG. 7B shows a graph 750 of implant concentration (y-axis) versus depth (x-axis) in accordance with embodiments of the present disclosure. In one example, implanting process 700, which may be used for example in process 214 of FIG. 2A, includes providing a polysilicon or amorphous silicon IC resistor (e.g., resistor 212) at block 702, implanting a pre-amorphization implant (PAI) (e.g., silicon or germanium) used to activate carbon and dopants at block 704, implanting a deactivation implant (e.g., xenon, germanium) at block 706, implanting a n-type or p-type dopant at block 608, and providing an end-of-line thermal process at block 710. Advantageously, the deactivation implant deactivates the dopant in the top region in order to minimize the resistance variance and raise CMP thickness margin.

In one example, the implanting process includes PAI implanting of germanium at an implant concentration between about 1e14 $cm^{-3}$ and about 1e15 $cm^{-3}$ and an implant energy between about 10 k and about 30 k, deactivation implanting of xenon at an implant concentration between about 1e14 $cm^{-3}$ and about 1e15 $cm^{-3}$ and an implant energy between about 10 k and about 30 k, and dopant implanting of barium fluoride at an implant concentration between about 1e14 $cm^{-3}$ and about 1e15 $cm^{-3}$ and an implant energy between about 30 k and about 60 k.

Advantageously, the semiconductor device of the present disclosure provides for an IC resistor implanting scheme that fixes the dopant at the bottom region of the resistor or deactivates dopant at the top region to achieve an inverse box-like dopant profile that minimizes resistance variation from planarization variation. Furthermore, the present disclosure allows for a separate resistor implant, compatibility with a high-k last or metal gate process, a wide polysilicon CMP margin, and minimization of resistance variance without a metal layer underneath the polysilicon resistor.

The present disclosure provides for many different embodiments. One of the broader forms of the present disclosure involves a semiconductor device. The device includes a substrate including an isolation region, and a resistor disposed over the isolation region, wherein the resistor includes an implant with an inverse box-like dopant profile that minimizes resistance variation from subsequent planarization variation. A contact is disposed over the resistor.

Another of the broader forms of the present disclosure involves another semiconductor device. The device includes a substrate including an isolation region and a device region, and a resistor disposed over the isolation region, wherein the resistor includes an implant with an inverse box-like dopant profile that minimizes resistance variation from subsequent planarization variation. The device further includes a high-k metal gate (HKMG) device disposed over the device region, the HKMG device including a metal gate disposed over the device region, a plurality of interlayer dielectric (ILD) layers disposed over the resistor and the HKMG device, a first contact disposed over and contacting the resistor through the plurality of ILD layers, and a second contact disposed over and contacting the HKMG device through the plurality of ILD layers.

Yet another of the broader forms of the present disclosure involves a method of fabricating a semiconductor device. The method includes providing a substrate including an isolation region, forming a resistor over the isolation region, implanting the resistor with an inverse box-like dopant profile that minimizes resistance variation from subsequent planarization variation, planarizing the resistor, and forming a contact over the resistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduce herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a substrate including an isolation region;
    a resistor disposed over the isolation region, wherein the resistor includes an implant with a dopant concentration that is step-increased at a depth of the resistor and that remains substantially constant as depth increases; and
    a contact disposed over the resistor.

2. The semiconductor device of claim 1, wherein the resistor comprises polysilicon or amorphous silicon.

3. The semiconductor device of claim 1, wherein the implant includes silicon, germanium, carbon, xenon, an n-type dopant, and/or a p-type dopant.

4. The semiconductor device of claim 1, wherein the implant includes germanium at an implant concentration between about 1e14 cm-3 and about 1e15 cm-3 and an implant energy between about 10 k and about 30 k, carbon at an implant concentration between about 1e14 cm-3 and about 1e15 cm-3 and an implant energy between about 10 k and about 20 k, and indium at an implant concentration between about 1e13 cm-3 and about 1e14 cm-3 and an implant energy between about 100 k and about 150 k.

5. The semiconductor device of claim 1, wherein the implant includes germanium at an implant concentration between about 1e14 cm-3 and about 1e15 cm-3 and an implant energy between about 10 k and about 30 k, xenon at an implant concentration between about 1e14 cm-3 and about 1e15 cm-3 and an implant energy between about 10 k and about 30 k, and barium fluoride at an implant concentration between about 1e14 cm-3 and about 1e15 cm-3 and an implant energy between about 30 k and about 60 k.

6. The semiconductor device of claim 1, wherein the substrate includes a device region including a metal oxide semiconductor (MOS) device fabricated simultaneously with the resistor.

7. The semiconductor device of claim 6, further comprising:
    an interlayer dielectric (ILD) layer disposed over the resistor and the MOS device; and
    a second contact disposed over the MOS device through the ILD layer.

8. A semiconductor device, comprising:
    a substrate including an isolation region and a device region;
    a resistor disposed over the isolation region, wherein the resistor includes an implant with a dopant concentration that is step-increased at a depth of the resistor and that remains substantially constant as depth increases;
    a high-k metal gate (HKMG) device disposed over the device region, the HKMG device including a metal gate disposed over the device region;
    a plurality of interlayer dielectric (ILD) layers disposed over the resistor and the HKMG device;
    a first contact disposed over and contacting the resistor through the plurality of ILD layers; and
    a second contact disposed over and contacting the HKMG device through the plurality of ILD layers.

9. The semiconductor device of claim 8, wherein the resistor comprises polysilicon or amorphous silicon.

10. The semiconductor device of claim 8, wherein the implant includes silicon, germanium, carbon, xenon, an n-type dopant, and/or a p-type dopant.

11. The semiconductor device of claim 8, wherein the implant includes germanium at an implant concentration between about 1e14 cm-3 and about 1e15 cm-3 and an implant energy between about 10 k and about 30 k, carbon at an implant concentration between about 1e14 cm-3 and about 1e15 cm-3 and an implant energy between about 10 k and about 20 k, and indium at an implant concentration between about 1e13 cm-3 and about 1e14 cm-3 and an implant energy between about 100 k and about 150 k.

12. The semiconductor device of claim 8, wherein the implant includes germanium at an implant concentration between about 1e14 cm-3 and about 1e15 cm-3 and an implant energy between about 10 k and about 30 k, xenon at an implant concentration between about 1e14 cm-3 and about 1e15 cm-3 and an implant energy between about 10 k and about 30 k, and barium fluoride at an implant concentration between about 1e14 cm-3 and about 1e15 cm-3 and an implant energy between about 30 k and about 60 k.

13. A semiconductor device, comprising:
    a substrate including an isolation region;
    a resistor over the isolation region, the resistor having a planar upper surface and a dopant concentration that is step-increased at a depth of the resistor and that remains substantially constant as depth increases; and
    a contact over the resistor.

14. The device of claim 13, wherein the resistor includes polysilicon or amorphous silicon.

15. The device of claim 13, wherein the resistor includes silicon, germanium, carbon, xenon, an n-type dopant, and/or a p-type dopant.

16. The device of claim 13, wherein the resistor includes germanium at an implant concentration between about 1e14 cm-3 and about 1e15 cm-3, carbon at an implant concentration between about 1e14 cm-3 and about 1e15 cm-3, and indium at an implant concentration between about 1e13 cm-3 and about 1e14 cm-3.

17. The device of claim 13, wherein the resistor includes germanium at an implant concentration between about 1e14 cm-3 and about 1e15 cm-3, xenon at an implant concentration between about 1e14 cm-3 and about 1e15 cm-3, and barium fluoride at an implant concentration between about 1e14 cm-3 and about 1e15 cm-3.

18. The device of claim 13, wherein the isolation region includes a shallow trench isolation.

19. The device of claim 13, further comprising a metal oxide semiconductor (MOS) device over a device region of the substrate.

20. The device of claim 19, further comprising:
an interlayer dielectric (ILD) layer over the resistor and the MOS device; and
a second contact over the MOS device through the ILD layer.

* * * * *